(12) United States Patent
Lee et al.

(10) Patent No.: US 7,537,998 B2
(45) Date of Patent: May 26, 2009

(54) METHOD FOR FORMING SALICIDE IN SEMICONDUCTOR DEVICE

(75) Inventors: Joon Hyeon Lee, Chungcheongbuk-do (KR); Woon Yong Kim, Seoul (KR)

(73) Assignee: Magnachip Semiconductor, Ltd., Cheongju (KR)

( * ) Notice: Subject to any disclaimer, the term of this patent is extended or adjusted under 35 U.S.C. 154(b) by 0 days.

(21) Appl. No.: 11/782,073

(22) Filed: Jul. 24, 2007

(65) Prior Publication Data
US 2007/0264811 A1    Nov. 15, 2007

Related U.S. Application Data

(62) Division of application No. 10/740,136, filed on Dec. 18, 2003, now Pat. No. 7,262,103.

(30) Foreign Application Priority Data

Jan. 21, 2003   (KR) .................. 10-2003-003957
Jan. 21, 2003   (KR) .................. 10-2003-003958

(51) Int. Cl.
*H01L 21/336* (2006.01)
(52) U.S. Cl. .................. 438/279; 438/981; 438/655; 438/587; 438/592
(58) Field of Classification Search .................. 438/279, 438/981, 655, 587, 592
See application file for complete search history.

(56) References Cited

U.S. PATENT DOCUMENTS 7,262,103 B2 *   8/2007   Lee et al. .................. 438/279

* cited by examiner

*Primary Examiner*—Jack Chen
(74) *Attorney, Agent, or Firm*—Ladas & Parry LLP

(57) ABSTRACT

Forming salicide in a semiconductor device includes the steps of: forming a first and a second gate oxide film and in a non-salicide region and a salicide region, the first gate oxide film being thicker than the second gate oxide film; forming a conductive layer and a nitride based hard mask layer, and then selectively removing the conductive layer, the hard mask layer, the first gate oxide film, and the second gate oxide film, thereby forming gate electrodes and simultaneously exposing an active region of the salicide region; forming a spacer oxide film on an upper surface, except for the hard mask layer, of a second resultant structure; selectively removing the spacer oxide film, thereby forming a spacer and simultaneously exposing the active region of the salicide region; removing the hard mask layer; and forming a salicide film on the upper surfaces of the gate electrodes and on the surface of the active region in the salicide region. Therefore, a non-salicide region and a salicide region can be formed selectively and simultaneously in a one-chip semiconductor device, so that the number of steps for a salicide forming process can be reduced.

6 Claims, 7 Drawing Sheets

METHOD FOR FORMING SALICIDE IN SEMICONDUCTOR DEVICE

BACKGROUND OF THE INVENTION

1. Field of the Invention

The present invention relates to a method for forming salicide in a semiconductor device, and more particularly to a method for forming salicide in a semiconductor device, which can selectively and simultaneously form salicide region (or Co-salicide region) and a non-salicide region (or non-Co-salicide in a one-chip semiconductor device.

2. Description of the Prior Art

The conventional method for forming salicide in a semiconductor device will be described as follows with reference to FIGS. 1A through 1E.

FIGS. 1A through 1E are cross-sectional views showing a conventional process of forming salicide in a semiconductor device.

According to a conventional salicide forming method of a semiconductor device, as shown in FIG. 1A, a gate oxide film 13 and a gate electrode 15 are sequentially formed on a silicon substrate 11 including a non-salicide region and a salicide region. Then, an LDD spacer 17 is formed on one side of the gate oxide film 13 and the gate electrode 15.

Next, as shown in FIG. 1B, an oxide film 19 is deposited on the upper surface of the resultant structure obtained through the above process, and then a photosensitive material layer 21 or a bottom anti-reflective coating (BARC) is formed in the non-salicide region A of the substrate. The oxide film 19 serves later as a barrier oxide film which prevents the generation of salicide in the non-salicide region during a salicide generating process.

Subsequently, as shown in FIG. 1C, an etch-back process is performed to the photosensitive material layer 21, and the photosensitive material layer 21 is removed. When the etch-back process of the photosensitive material layer 21 is performed, activated plasma, such as $CHF_3/CF_4/O_2/Ar$, and the likes, is used. In addition, $N_2$ gas, CxFy gas, such as $C_4F_8$, $C_2F_6$, and $C_5F_8$, and the likes can be used. Also, while the etch-back process of the photosensitive material layer 21 is performed, an etching process progresses to the oxide film 19 located on the gate electrode 15 so that there is no residual oxide film on the gate electrode 15.

Next, as shown in FIG. 1D, a photosensitive pattern 23 is formed on the non-salicide region A. Then, after the oxide film 19 located in the salicide region B of the substrate is selectively removed using the photosensitive pattern 23 as a mask, the photosensitive pattern 23 is removed. At this time, etching of a portion of the oxide film 19 is performed using activated plasma of $CHF_3/CF_4/O_2/Ar$, etc. In addition, $N_2$ gas and CxFy gas, such as $C_4F_8$, $C_2F_6$, and $C_5F_8$, and the likes can be used.

Subsequently, as shown in FIG. 1E, salicide (or Co-salicide) 25 is formed on the exposed portion of the gate electrode 15 in the non-salicide region A, and on the exposed portions of the silicon substrate 11 and the gate electrode 15 in the salicide region B. At this time, in the non-salicide part, salicide (or Co-salicide) is not generated due to a residual oxide barrier.

In accordance with the conventional method described above, -after an LDD structure is formed, an oxide film formed in the salicide region is removed by using a photosensitive pattern as a barrier. Subsequently, after the photosensitive pattern is removed, a salicide layer is formed, so that steps of the salicide forming process are increased.

SUMMARY OF THE INVENTION

Accordingly, the present invention has been made to solve the above-mentioned problems occurring in the prior art, and an object of the present invention is to provide a method for forming salicide in a semiconductor device, which can selectively and simultaneously form a salicide region (or Co-salicide region) and a non-salicide region (or non-Co-salicide region) in a one-chip semiconductor device, thereby enabling steps of the salicide forming process to be reduced.

In order to accomplish this object, there is provided a method for forming salicide in a semiconductor device, the method comprising the steps of: (1) forming a first gate oxide film and a second gate oxide film in a non-salicide region and a salicide region of a silicon substrate, respectively, the first gate oxide film being thicker than the second gate oxide film; (2) forming a conductive layer and a nitride based hard mask layer on an upper surface of a first resultant structure obtained through step (1), and then selectively removing the conductive layer, the hard mask layer, the first gate oxide film, and the second gate oxide film, thereby forming gate electrodes respectively in the non-salicide region and the salicide region and simultaneously exposing an active region of the salicide region; (3) forming a spacer oxide film on an upper surface, except for the hard mask layer, of a second resultant structure obtained through steps (1) to (2); (4) selectively removing the spacer oxide film, thereby forming a spacer on one side of each of the gate electrodes and simultaneously exposing the active region of the salicide region; (5) removing the hard mask layer remaining on upper surfaces of the gate electrodes in the non-salicide region and the salicide region; and (6) forming a salicide film on the upper surfaces of the gate electrodes in the non-salicide region and the salicide region and on the surface of the active region in the salicide region.

In accordance with another aspect of the present invention, there is provided a method for forming salicide in a semiconductor device, the method comprising the steps of: (1) forming a first gate oxide film and a second gate oxide film in a non-salicide region and a salicide region of a silicon substrate, respectively, the first gate oxide film being thicker than the second gate oxide film; (2) forming a conductive layer on an upper surface of a first resultant structure obtained through step (1), and then selectively removing the conductive layer, the first gate oxide film, and the second gate oxide film, thereby forming gate electrodes respectively in the non-salicide region and the salicide region and simultaneously exposing an active region of the salicide region; (3) forming an ONO thin film and a nitride film on an upper surface of a second resultant structure which has been obtained through steps (1) to (2) and includes the gate electrodes; (4) selectively removing the ONO thin film and the nitride film located in the salicide region; (5) removing the nitride film remaining in the salicide region and forming a spacer on one side of each of the gate electrodes; and (6) forming a salicide film on the upper surfaces of the gate electrodes in the non-salicide region and the salicide region and on the surface of the active region in the salicide region.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
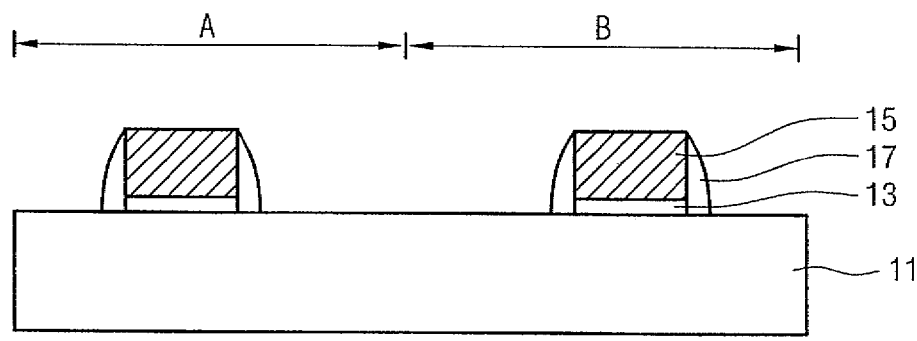
FIGS. 1A through 1E are cross-sectional views showing a conventional process of forming salicide in a semiconductor device.
Figure 1B:
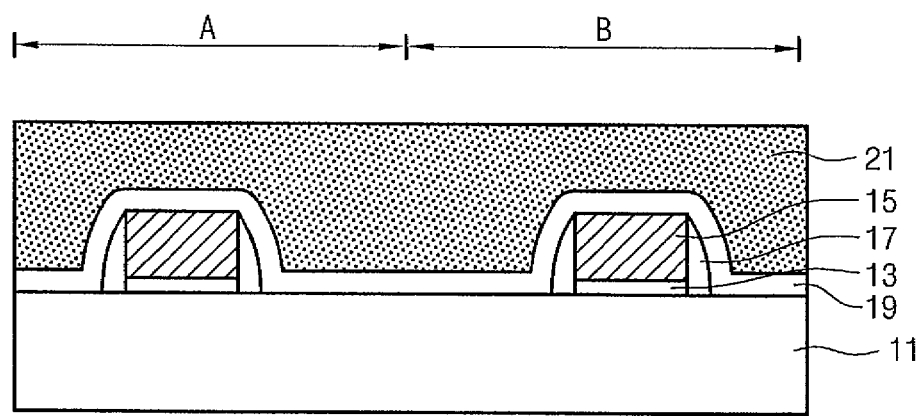
Figure 1C:
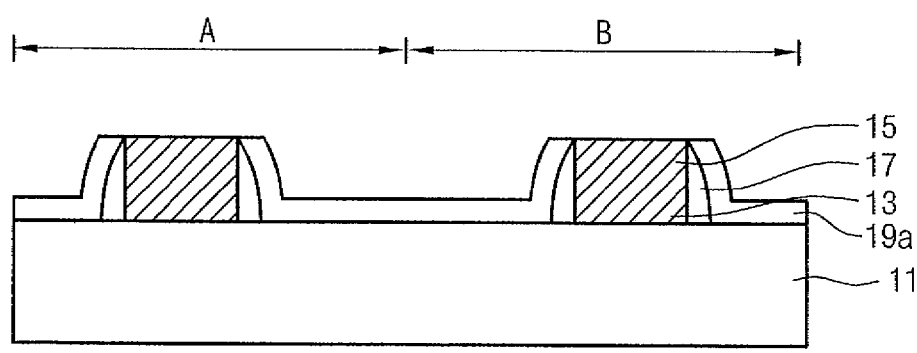
Figure 1D:
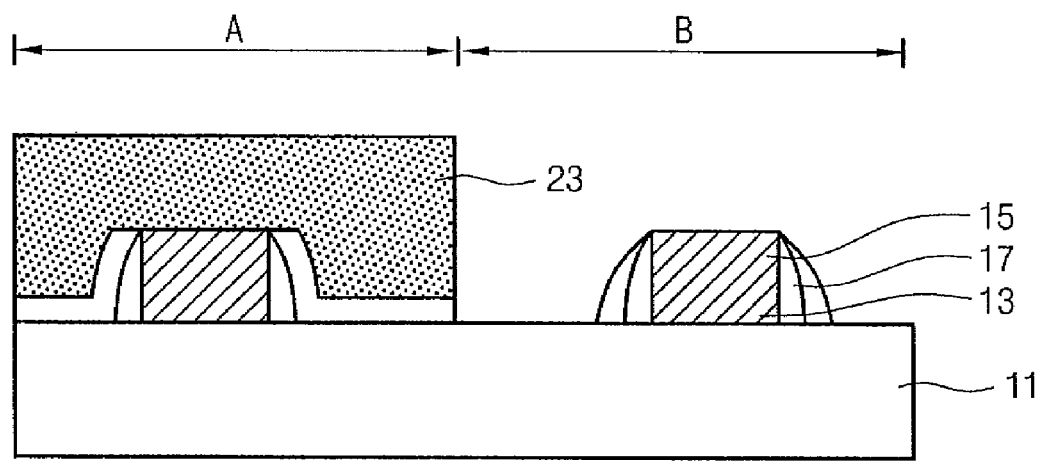
Figure 1E:
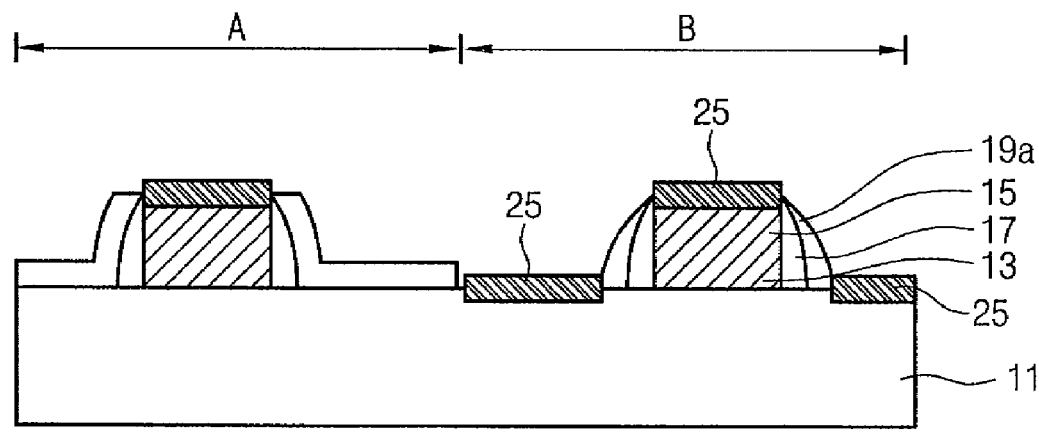

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 3A through 3F are cross-sectional views showing a process of forming salicide in a semiconductor device according to one embodiment of the present invention.

Figure 3A:
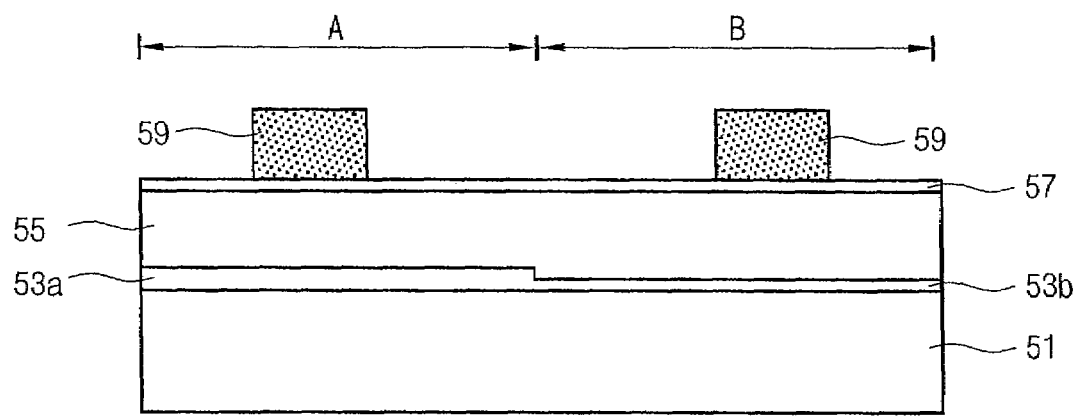
FIGS. 3A through 3F are cross-sectional views showing a process of forming salicide in, a semiconductor device according to another embodiment of the present invention.

According to a method for forming salicide in a semiconductor device of the present invention, as shown in FIG. 3A, first, a dual gate oxide film including a thick gate oxide film 53a and a thin gate oxide film 53b is formed on the surface of a silicon substrate 51. The surface of the silicon substrate 51 is divided into a non-salicide region A and a salicide region B. At this time, the thick gate oxide film 53a is formed on the non-salicide region A and the thin gate oxide film 53b is formed on the salicide region B.

Next, a polysilicon layer 55 for gate formation and a nitride based hard mask layer 57 are deposited on the dual gate oxide film, and then a first photosensitive pattern 59 for patterning the polysilicon layer 35 is formed thereon. The first photosensitive pattern 59 is formed on each of the non-salicide region A and the salicide region B.

Figure 3B:
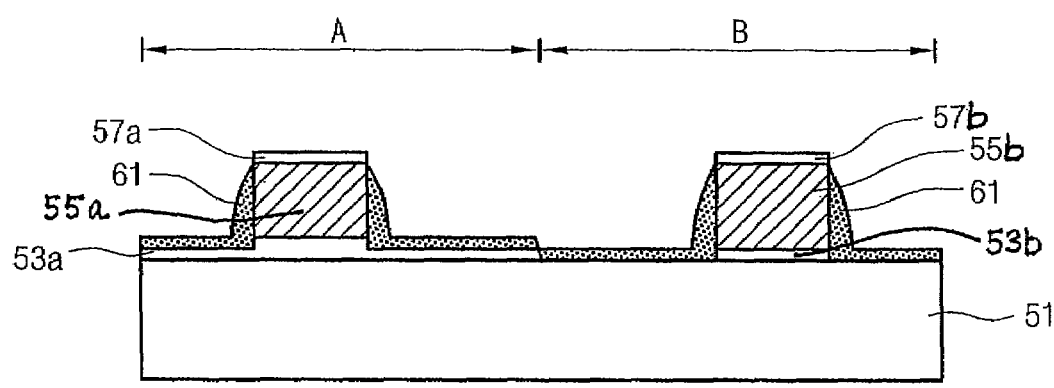

Subsequently, as shown in FIG. 3B, the polysilicon layer 55 and the hard mask layer 57 are selectively removed using the first photosensitive pattern 59 as a mask, so as to form gate electrodes 55a, 55b. When the nitride based hard mask layer 57 is primarily etched, activated plasma, such as $CHF_3/CF_4/O_2/Ar$, or $C_4F_8/O_2/Ar$, is used. In addition, $N_2$ gas, CxFy gas, such as $C_4F_8$, $C_2F_6$, and $C_5F_8$, and the likes can be used. Here, flow rates of etching gases are as follows; $CHF_3$: 1~200 sccm, $CF_4$: 1~200 sccm, $O_2$: 0~20 sccm, and Ar: 1~1000 sccm. Besides these, $C_4F_8$ of 1~50 sccm and $N_2$ of 0~500 scorn may be used as etching gases.

Secondarily, when the polysilicon layer 55 is etched to form the gate electrodes 55a, 55b, activated plasma, such as $Cl_2/HBr/He—O_2/Ar$ and the likes, is used.

When the etching processes to form the gate electrodes 55a, 55b are performed as described above, a gate electrode pattern 57b is formed on the thin gate oxide film 55b of the salicide region B, and the thin gate oxide film 53b of an active region is etched to expose the surface of the silicon substrate 51. In contrast, a part of the thick gate oxide film 53a in the non-salicide region A remains even after the gate electrode pattern has been formed. This is because the etching selectivity of the polysilicon layer to the oxide film is about 200~300 to 1.

Next, the first photosensitive pattern 59 is removed, and then an oxidation process is performed on the surface of a resultant structure obtained through the above process to form an oxide film 61 thereon. Herein, the oxide film 61 is formed to protect a thick gate oxide film 53a remaining in an active region of the non-salicide region A, when the etching of an LDD oxide film (e.g., shown in FIG. 3C, element 63) is performed in a following process as this will be described below. The oxide film 61 is not formed on the nitride based hard mask layer 57a or 57b located respectively on the gate electrodes 55a, 55b. The oxide film 61 is not formed on the nitride layer 57a or 57b, but is formed on the sidewalls of the gate electrodes 55a, 55b and the exposed area of the silicon substrate 31 in the salicide region B as this is fully shown in FIG. 3B.

Figure 3C:
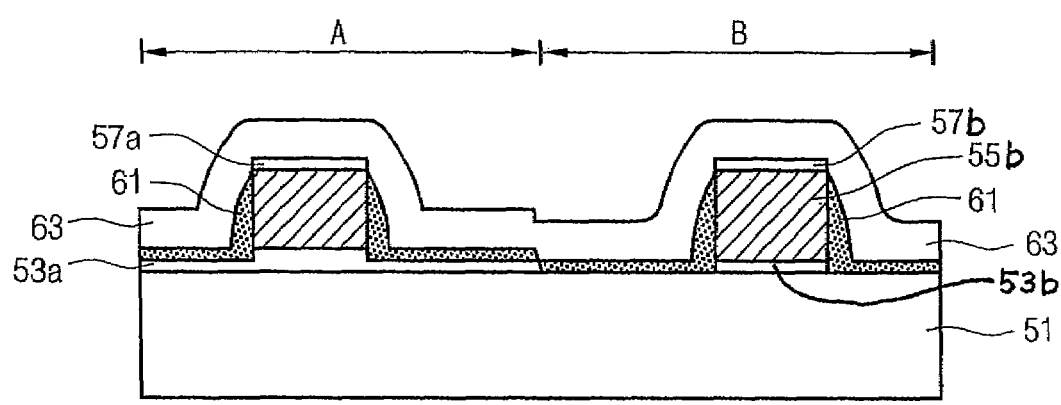

Subsequently, as shown in FIG. 3C, an LDD oxide film 63 is deposited on the resultant structure obtained through the above process.

Figure 3D:
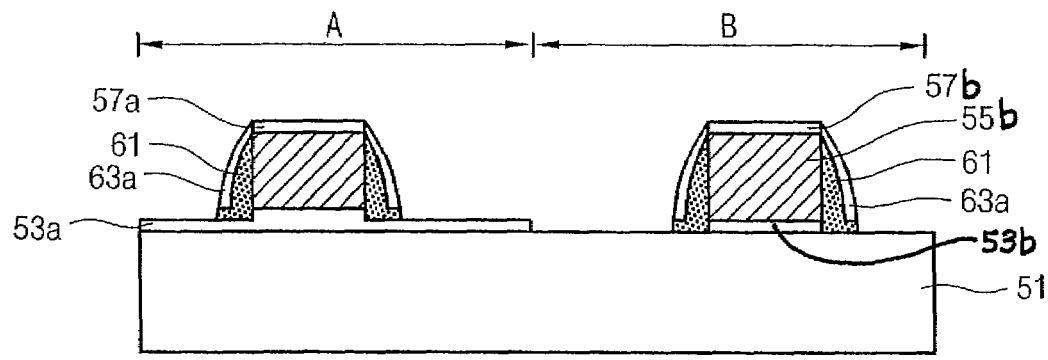

Next, as shown in FIG. 3D, blanking etching of the LDD oxide film 63 is performed to form a spacer 63a on each side of each of the gate electrodes 55a, 55b. When the LDD oxide film 63 is etched, activated plasma, such as $CHF_3/CF_4/O_2/Ar$, or $C_4F_8/O_2/$—Ar, is used. In addition, $N_2$, $O_2$, and CxFy such as $C_4F_8$, $C_2F_6$, $C_5F_8$, and the likes can be used. That is, an etching of the LDD oxide film 43 can be performed using activated plasma of $CHF_3/CF_4/O_2/Ar$. In addition, $N_2$ gas and CxFy gas such as $C_4F_8$, $C_2F_6$, $C_5F_8$ can be used. Here, each flow rate of the etching gases is as follows; $CHF_3$: 1~200 sccm, $CF_4$: 1~200 sccm, $O_2$: 0~20 sccm, and Ar: 1~1000 sccm. Besides these, $C_4F_8$ of 1~50 sccm and $N_2$ of 0~500 sccm may be used as etching gases.

When an etching step is performed as described above, the surface of an active region in the salicide region B of the silicon substrate is exposed. In contrast, on the surface of an active region in the non-salicide region A of the silicon substrate, a remaining oxide film continuously remains.

Figure 3E:
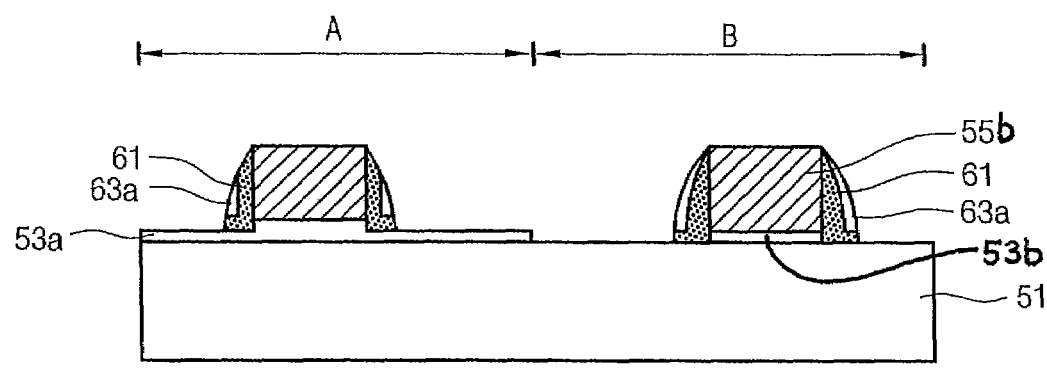

Subsequently, as shown in FIG. 3E, a hard mask layer pattern 57a or 57b remaining on the upper surfaces of either one of the gate electrodes 55a, 55b is etched by a down flow method using an O2/CF4 gas. When etching is performed by such a down flow method, the etching selectivity of the nitride film to the oxide film becomes about 12:1. Therefore, since oxide film is nearly not removed, the oxide film located on the active region of the non-salicide region A remains, and -the upper surfaces of the gate electrodes and the silicon substrate, on which a nitride film has existed, are exposed.

Figure 3F:
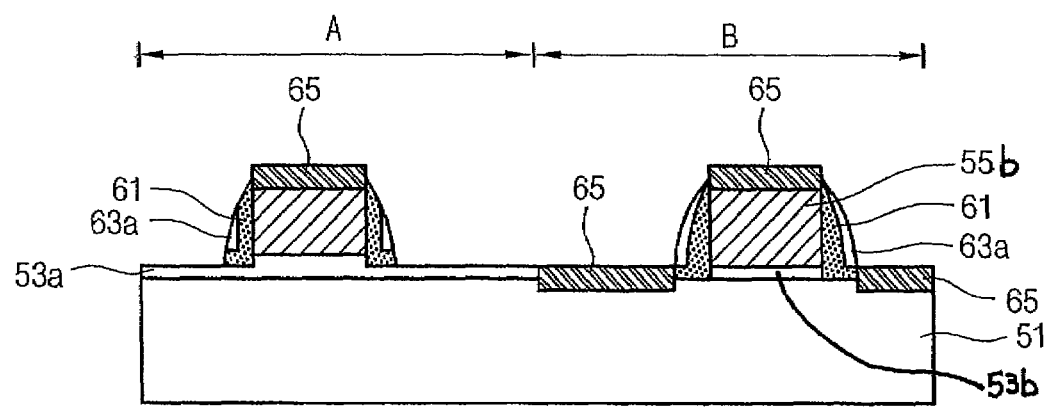

Next, as shown in FIG. 3F, salicide films 65 are formed on the exposed upper surfaces of the gate electrodes 55a, 55b and also formed on the exposed surfaces of the active region of the salicide region B as shown with the same reference numeral 65 in FIG. 3F.

Meanwhile, a method for forming salicide in a semiconductor device according to another embodiment of the present invention will be described as follows with reference to FIGS. 2A-2G.

FIGS. 2A-2G are, cross-sectional views showing a process of forming salicide in a semiconductor device according to another embodiment of the present invention.

Figure 2A:
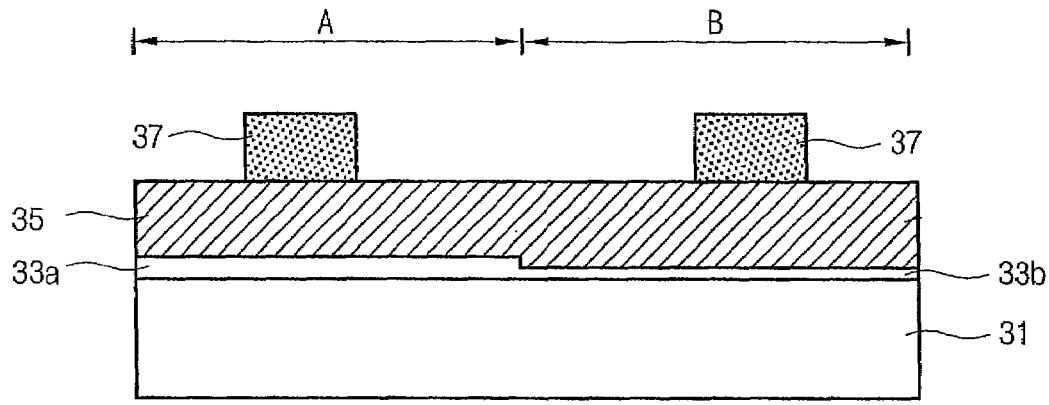
FIGS. 2A through 2G are cross-sectional views showing a process of forming salicide in a semiconductor device according to one embodiment of the present invention.

According to a method for forming form salicide in a semiconductor device of the present invention, as shown in FIG. 2A, first, a dual gate oxide film including a thick gate oxide film 33a and a thin gate oxide film 33b is formed on the surface of a silicon substrate 31. Herein, the surface of the silicon substrate 31 is divided into a non-salicide region A and a salicide region B. At this time, the thick gate oxide film 33a is formed on the non-salicide region A and the thin gate oxide film 33b is formed on the salicide region B.

Next, a polysilicon layer 35 for gate formation is deposited on the dual gate oxide film, and then a first photosensitive pattern 37 for patterning the polysilicon layer 35 is formed thereon. The first photosensitive pattern 37 is formed in each of the non-salicide region A and the salicide region B.

Figure 2B:
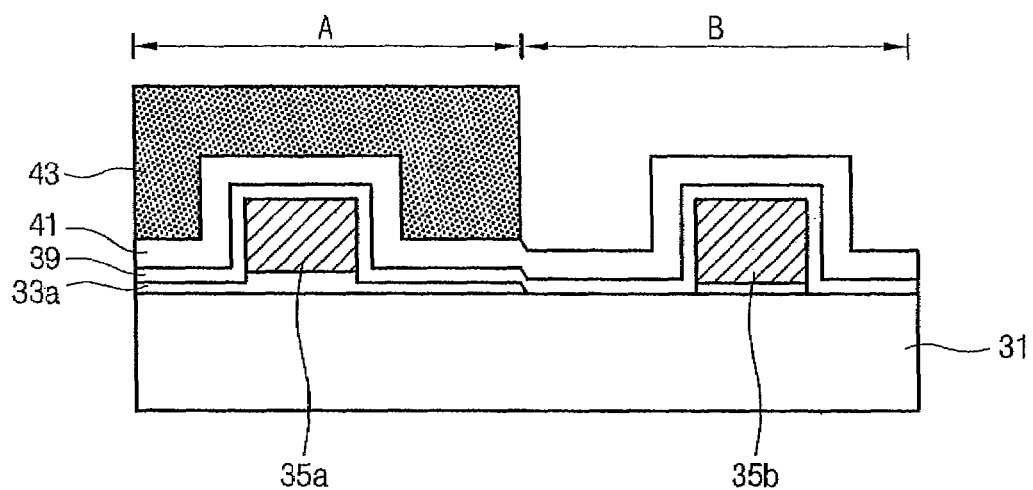

Subsequently, as shown in FIG. 2B, the polysilicon layer 35 is selectively removed using the first photosensitive pattern 37 (as shown in FIG. 2A) as a mask, so as to form gate electrodes 35a, 35b.

Next, after the first photosensitive pattern 37 is removed, an ONO thin film 39 and a nitride film 41 are stacked on the upper surface of a resultant structure, which has been obtained through the above process and includes the gate electrodes 35a, 35b. Thereafter, a second photosensitive pattern 43 is formed only on the non-salicide region A.

Figure 2C:
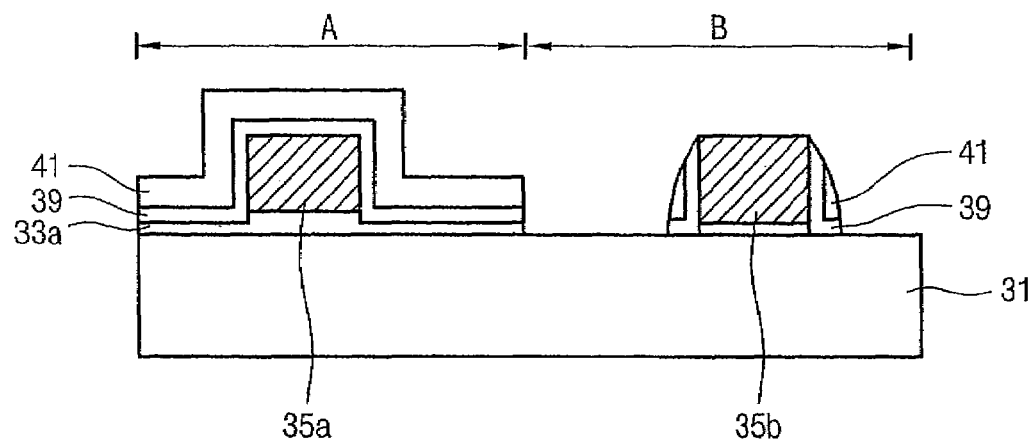

Subsequently, as shown in FIG. 2C, the nitride film 41 and the ONO thin film 39, which are located in the salicide region B, are removed by using the second photosensitive pattern 43 as a mask. When the nitride film 41 and the ONO thin film 39 are etched, activated plasma, such as $CHF_3/CF_4/O_2/Ar$ or so forth, is used. In addition, $N_2$ gas and CxFy gas such as $C_4F_8$, $C_2F_6$, $C_5F_8$, and the likes can be used. Here, each flow rate of the etching gases is as follows; $CHF_3$: 1~200 sccm, $CF_4$: 1~200 sccm, $O_2$: 0~20 sccm, and Ar: 1~1000 sccm. Besides these, $C_4F_8$ of 1~50 sccm and $N_2$ of 0~500 sccm may be used as etching gases.

Next, the second photosensitive pattern 43 is removed by means of either $O_2$ plasma or an $O_2$ down flow method.

Figure 2D:
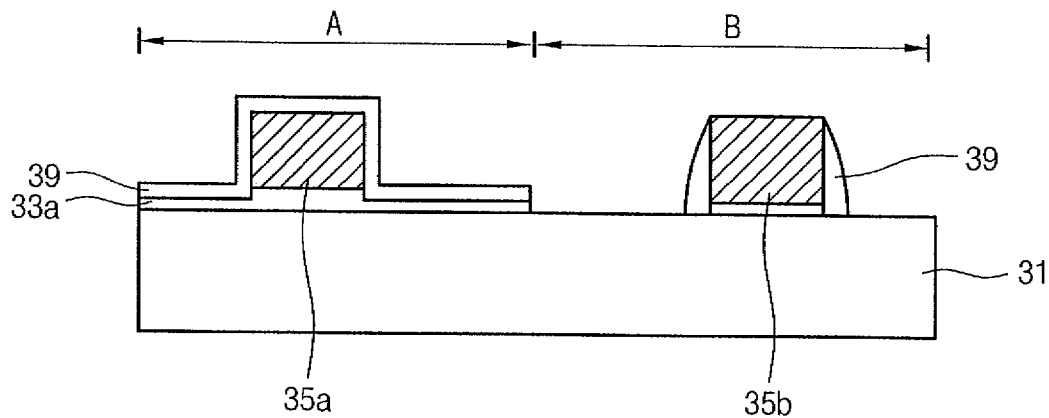

Subsequently, as shown in FIG. 2D, a blanket etching is performed by a down flow method, so as to selectively remove the remaining nitride film 41 and ONO thin film 39. At this time, the etching of the nitride film is performed by a down flow method using $O_2/CF_4$ gas. When etching is performed by a down flow method as described above, the etching selectivity of the nitride film to the oxide film becomes about 12:1. Therefore, since oxide film is nearly not removed, 'ON' portion of the ONO thin film 39 is removed, and only 'O (Oxide)' portion thereof remains.

Figure 2E:
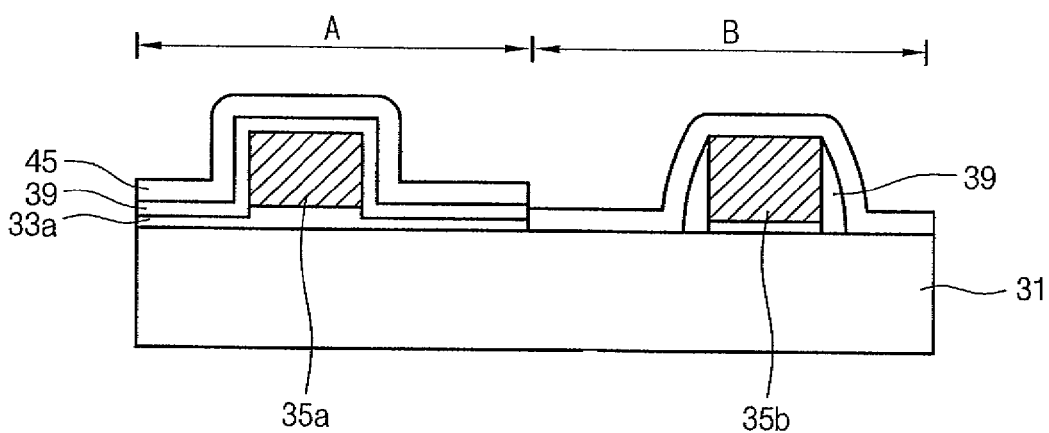

Next, as shown in FIG. 2E, an oxide film 45 for forming an LDD structure is deposited on the upper surface of a resultant structure obtained through the above process.

Figure 2F:
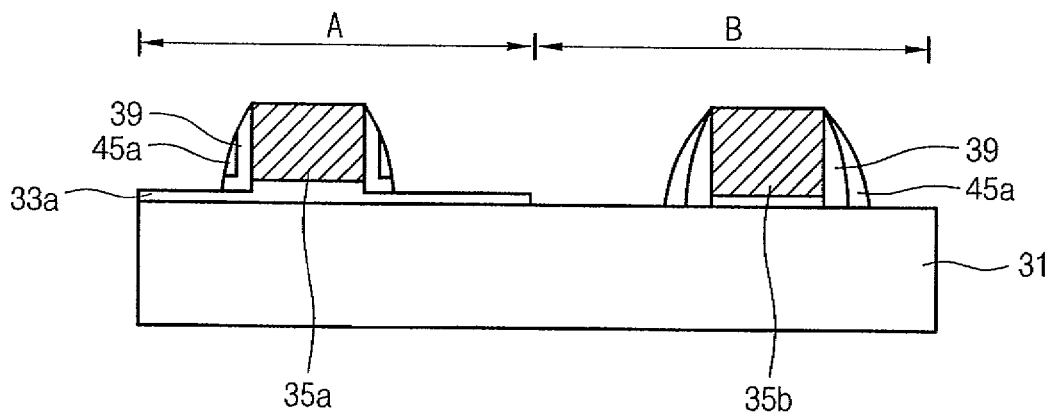

Subsequently, as shown in FIG. 2F, the oxide film 45 is dry-etched to form a spacer 45a on one side of each of the gate electrodes 35a and 35b. The oxide film 45 is etched by utilizing activated plasma, such as $CHF_3/CF_4/O_2/Ar$, or $C_4F_8/O_2/Ar$, or so forth. In addition, $N_2$, $O_2$, and CxFy such as $C_4FB$, $C_2F_6$, $C_5F_8$, and the likes can be used. That is, etching of the oxide film 45 can be performed using activated plasma of $CHF_3/CF_4/O_2/Ar$. Herein, $N_2$ gas and CxFy gas, such as $C_4F_8$, $C_2F_6$, $C_5F_8$, can be used. Here, each flow rate of the etching gases is as follows; $CHF_3$: 1~200 sccm, $CF_4$: 1~200 sccm, $O_2$: 0~20 sccm, and Ar: 1~1000 sccm. Besides these, $C_4F_8$ of 1~50 sccm and $N_2$ of 0~500 sccm may be used as etching gases.

When such an etching process is performed, the oxide layer continuously remains in the active region of the non-salicide region A, without leaving the oxide layer on both surface of the active region of the salicide region B and upper surfaces of the gate electrodes.

Figure 2G:
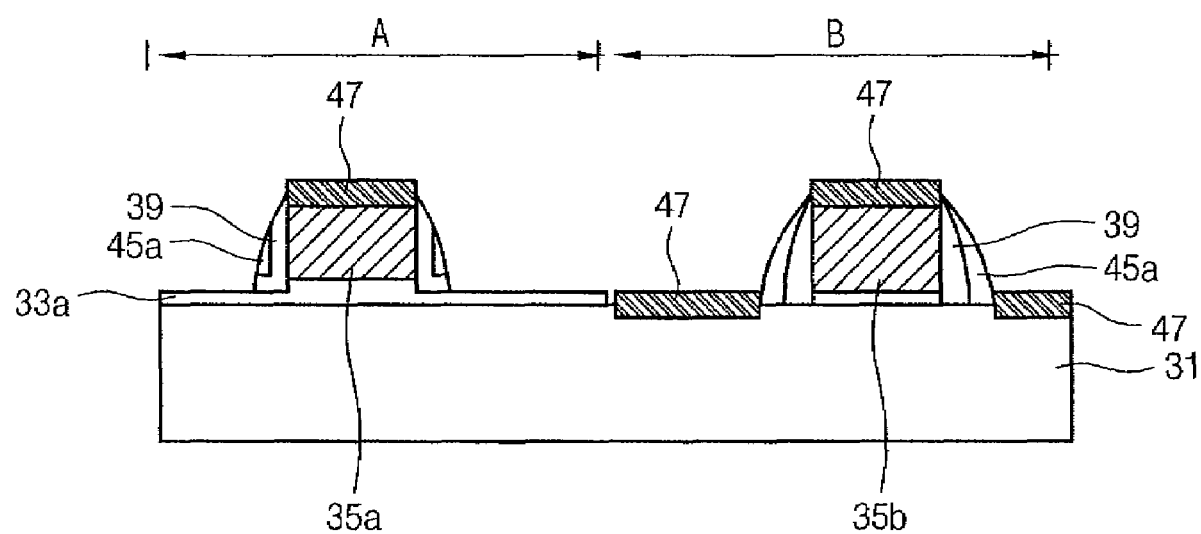

Next, as shown in FIG. 2G, salicide films 47 are formed on the exposed upper surfaces of the gate electrodes 35a and 35b and the exposed surfaces of the active region of the salicide region B.

According to the method for forming salicide in the semiconductor device of the present invention, it is not required to perform an etch back process for the photosensitive film (or BARC), so contamination caused by particles can be reduced during the salicide forming process.

Also, according to the method of the present invention, different from the conventional method, the LDD spacer can be separately formed in the non-salicide region (or Co-salicide region) and the salicide region.

Also, salicide can be selectively formed in the non-salicide region and the salicide region.

Although a preferred embodiment of the present invention has been described for illustrative purposes, those skilled in the art will appreciate that various modifications, additions and substitutions are possible, without departing from the scope and spirit of the invention as disclosed in the accompanying claims.

The invention claimed is:

1. A method for forming salicide in a semiconductor device, the method comprising the steps of:
   (1) forming a first gate oxide film and a second gate oxide film in a non-salicide region and a salicide region of a silicon substrate, respectively, the first gate oxide film being thicker than the second gate oxide film;
   (2) forming a conductive layer and a nitride based hard mask layer on an upper surface of a first resultant structure obtained through step (1), and then selectively removing the conductive layer, the hard mask layer, the first gate oxide film, and the second gate oxide film, thereby forming gate electrodes respectively in the non-salicide region and the salicide region and simultaneously exposing an active region of the salicide region;
   (3) forming a spacer oxide film on an upper surface, except for the hard mask layer, of a second resultant structure obtained through steps (1) to (2);
   (4) selectively removing the spacer oxide film, thereby forming a spacer on one side of each of the gate electrodes and simultaneously exposing the active region of the salicide region;
   (5) removing the hard mask layer remaining on upper surfaces of the gate electrodes in the non-salicide region and the salicide region; and
   (6) forming a salicide film on the upper surfaces of the gate electrodes formed in the non-salicide region and the salicide region, and on the surface of the active region in the salicide region.

2. The method as claimed in claim 1, wherein an etching process for the hard mask layer and the conductive layer includes first and second etching steps.

3. The method as claimed in claim 2, wherein when the second etching step for the conductive layer is performed, activated plasma including $Cl_2/HBr/He$—$O_2/Ar$ is used.

4. The method as claimed in claim 1, wherein the hard mask layer has a thickness of 1~500 Å.

5. The method as claimed in claim 1, wherein etching gases used for etching the spacer oxide film and flow rates thereof are $CHF_3$: 1~200 sccm, $CF_4$: 1~200 sccm, $O_2$: 0~20 sccm, Ar: 1~1000 sccm, $C_4F_8$: 1A~50 sccm and $N_2$: 0~500 sccm.

6. The method as claimed in claim 1, wherein an etching process of the hard mask layer is performed by a down flow method with using $O_2/CF_4$ as etching gas.

\* \* \* \* \*